US012790693B2

(12) United States Patent
Oosterlaken

(10) Patent No.: US 12,790,693 B2
(45) Date of Patent: Nov. 10, 2026

(54) GAS INJECTOR FOR A VERTICAL FURNACE

(71) Applicant: ASM IP Holding B.V, Almere (NL)

(72) Inventor: Theodorus G.M. Oosterlaken, Oudewater (NL)

(73) Assignee: ASM IP Holding B.V., Almere (NL)

( * ) Notice: Subject to any disclaimer, the term of this patent is extended or adjusted under 35 U.S.C. 154(b) by 681 days.

(21) Appl. No.: 17/934,956

(22) Filed: Sep. 23, 2022

(65) Prior Publication Data

US 2023/0111229 A1 Apr. 13, 2023

Related U.S. Application Data

(60) Provisional application No. 63/249,829, filed on Sep. 29, 2021.

(51) Int. Cl.
*C23C 16/455* (2006.01)
*C23C 16/458* (2006.01)

(52) U.S. Cl.
CPC .. *C23C 16/45578* (2013.01); *C23C 16/45514* (2013.01); *C23C 16/4587* (2013.01)

(58) Field of Classification Search
CPC ........ C23C 16/45578; C23C 16/45514; C23C 16/4587; C23C 16/4557; C23C 16/45512; C23C 16/4583; C23C 16/45546; C23C 16/45561; C23C 16/54; C23C 16/45551; C23C 16/545; C23C 16/4412; C23C 14/568; C23C 16/4401; B01F 23/10; B01F 25/23; H01J 37/3244; H01J 37/32449; H01L 21/6719; H01L 21/67196; H01L 21/67201; H01L 21/67173; H01L 21/67184; H01L 21/6776; H01L 21/67161; H01L 21/67155; H01L 21/67017;
(Continued)

(56) References Cited

U.S. PATENT DOCUMENTS

| | | | | |
|---|---|---|---|---|
| 4,911,102 | A * | 3/1990 | Manabe | C30B 25/02 257/E33.045 |
| 5,029,554 | A | 7/1991 | Miyashita et al. | |
| 5,252,133 | A | 10/1993 | Miyazaki et al. | |

(Continued)

FOREIGN PATENT DOCUMENTS

| | | |
|---|---|---|
| CN | 102388162 A | 3/2012 |
| CN | 105393335 A | 3/2016 |

(Continued)

*Primary Examiner* — Rudy Zervigon
(74) *Attorney, Agent, or Firm* — Banner & Witcoff, Ltd.

(57) ABSTRACT

The present disclosure relates to a gas injector for injecting a process gas in a process chamber. The gas injector comprises an injector tube comprising a plurality of process gas injection holes spaced apart from one another to deliver the process gas in the process chamber. The gas injector also comprises a feed entry of the injector tube for injecting the process gas into the injector tube and a mixing chamber is provided and is configured to mix a first reactant gas and a second reactant gas, thereby forming the process gas. The mixing chamber is directly connected to the feed entry and has first and second inlets for letting the first and second reactant gas in the mixing chamber. The first and second inlets are facing each other to improve mixing in the mixing chamber of the first and second reactant gas.

18 Claims, 4 Drawing Sheets

(58) Field of Classification Search
CPC ......... H01L 21/67069; H01L 21/67748; H01L 21/67751; H01L 21/67745
USPC ........................ 118/715; 156/345.33, 345.34
See application file for complete search history.

(56) References Cited

U.S. PATENT DOCUMENTS

| | | | | |
|---|---|---|---|---|
| 5,846,330 | A * | 12/1998 | Quirk | C23C 16/4558 219/121.36 |
| 6,062,256 | A * | 5/2000 | Miller | H10N 30/2042 251/129.05 |
| 6,596,085 | B1 * | 7/2003 | Schmitt | C23C 16/4486 118/726 |
| 6,772,710 | B2 * | 8/2004 | Lee | C23C 16/45563 118/316 |
| 6,884,296 | B2 * | 4/2005 | Basceri | C23C 16/45514 156/345.33 |
| 7,381,274 | B2 * | 6/2008 | Lee | C23C 16/45544 156/345.33 |
| 9,163,311 | B2 * | 10/2015 | Hasegawa | C23C 16/45578 |
| 9,951,421 | B2 * | 4/2018 | Lind | H01J 37/32449 |
| 10,870,916 | B2 * | 12/2020 | Ikeda | C23C 16/45546 |
| 10,982,325 | B2 | 4/2021 | Kostamo et al. | |
| 11,021,796 | B2 * | 6/2021 | Lee | C23C 16/52 |
| 11,248,296 | B2 * | 2/2022 | Wakabayashi | C23C 16/4481 |
| 11,732,355 | B2 * | 8/2023 | Pandey | H01J 37/3244 118/723 R |
| 11,772,058 | B2 * | 10/2023 | Lin | B01F 35/1453 366/144 |
| 12,023,636 | B2 * | 7/2024 | Hatanaka | B01F 25/3131 |
| 12,351,915 | B2 * | 7/2025 | Pudas | C23C 16/45563 |
| 2003/0044533 | A1 * | 3/2003 | Lee | C23C 16/45563 427/255.28 |
| 2003/0111013 | A1 * | 6/2003 | Oosterlaken | C23C 16/45578 118/724 |
| 2004/0035358 | A1 * | 2/2004 | Basceri | C23C 16/45514 427/248.1 |
| 2004/0255858 | A1 * | 12/2004 | Lee | C23C 16/45544 118/715 |
| 2005/0270895 | A1 | 12/2005 | Strang | |
| 2007/0141812 | A1 * | 6/2007 | Zagwijn | C23C 16/45523 438/479 |
| 2008/0286981 | A1 * | 11/2008 | Hasper | C23C 16/34 118/704 |
| 2009/0035946 | A1 * | 2/2009 | Pierreux | H01L 21/022 257/E21.24 |
| 2009/0269250 | A1 * | 10/2009 | Panagiotou | B01F 25/23 422/129 |
| 2009/0320756 | A1 * | 12/2009 | Tanaka | H01J 37/32697 118/723 MW |
| 2010/0314412 | A1 * | 12/2010 | Kadyk | B67D 1/0024 222/145.5 |
| 2011/0277681 | A1 | 11/2011 | Arena et al. | |
| 2014/0174362 | A1 * | 6/2014 | Kao | C23C 16/45565 118/723 R |
| 2016/0145766 | A1 | 5/2016 | Kim | |
| 2016/0168704 | A1 | 6/2016 | Choi et al. | |
| 2016/0333478 | A1 * | 11/2016 | Tatsuoka | C23C 16/45574 |
| 2019/0262785 | A1 * | 8/2019 | Hatanaka | C12M 99/00 |
| 2019/0330740 | A1 | 10/2019 | Klaver | |
| 2021/0113972 | A1 * | 4/2021 | Lin | B01F 25/23 |
| 2021/0354204 | A1 * | 11/2021 | Fukunaga | C23C 16/45512 |
| 2023/0151485 | A1 * | 5/2023 | Sakatsume | H01L 21/6723 427/255.28 |
| 2023/0184428 | A1 * | 6/2023 | Coleman | B01F 25/21 |
| 2024/0068095 | A1 * | 2/2024 | Chang | C23C 16/45512 |

FOREIGN PATENT DOCUMENTS

| | | | |
|---|---|---|---|
| CN | 110416050 | A | 11/2019 |
| EP | 0747503 | A | 12/1996 |
| EP | 3711883 | A1 | 9/2020 |
| JP | H06349761 | A | 12/1994 |
| JP | H07312364 | A | 11/1995 |
| JP | 2004006551 | A | 1/2004 |
| JP | 2004270005 | A | 9/2004 |
| JP | 2007194331 | A | 8/2007 |
| KR | 20000027055 | A | 5/2000 |
| KR | 20030030058 | A | 4/2003 |
| KR | 20060069720 | A | 6/2006 |
| TW | 202113149 | A | 4/2021 |

* cited by examiner

GAS INJECTOR FOR A VERTICAL FURNACE

TECHNICAL FIELD OF THE INVENTION

The present invention relates to the field of semiconductor device fabrication. More specifically, it relates to a gas injector for a vertical furnace and to a vertical furnace that includes such a gas injector.

BACKGROUND OF THE INVENTION

As the requirements of integrated circuit fabrication become more and more stringent due to the challenges in device scaling and the challenges in economic considerations, batch processing continues to gain more importance.

For a number of processes used in the semiconductor manufacturing involving batch processing, mixing of reactant gases may be extremely important. This is due to various reasons, one of which may be related to the fact that mixing has to occur in a specific temperature range in order to deposit films uniformly on substrates. While mixing of gases may induce condensation when it is done at a too low temperature, it may lead to unwanted deposition when done at a too high temperature.

In view of the growing importance for batch processing, mixing of gases thus, may become more critical in semiconductor manufacturing in the making of future generation devices.

There is, therefore, a need in the art to provide an improved gas injector and a vertical furnace including such a gas injector.

SUMMARY OF THE INVENTION

It is an object of the present invention to provide an improved gas injector. More specifically, it may be an objective to provide a gas injector enabling a quicker mixing at a lower temperature. To at least partially achieve this goal, the present disclosure may provide a gas injector and a vertical furnace including such a gas injector, as defined in the independent claims. Further embodiments of the gas injector and the vertical furnace are provided in the dependent claims. Further and alternative objectives may be understood from the following.

According to a first aspect, the present invention relates to a gas injector for injecting a process gas in a process chamber. The gas injector may be elongated along a first axis from a first to a second end and may comprise an injector tube that may be extending to the first end and that may be comprising a plurality of process gas injection holes spaced apart from one another along said first axis to deliver the process gas in the process chamber. The gas injector may also comprise a feed entry of the injector tube for injecting the process gas into the injector tube and a mixing chamber may be provided near the second end and is configured to mix a first reactant gas and a second reactant gas, thereby forming the process gas. The mixing chamber may be directly connected to the feed entry and may have first and second inlets for letting the first and second reactant gas in the mixing chamber, wherein the first and second inlets may be facing each other to improve mixing in the mixing chamber of the first and second reactant gas.

The inventive gas injector according to the first aspect may allow for mixing of the reactant gases before entry into the main body of the gas injector thanks to the mixing chamber.

It may be an advantage of embodiments of the first aspect that it may allow allows for head-on mixing of the reactant gases in the mixing chamber, therefore improving mixing before entry into the main body of the gas injector.

It may be an advantage of embodiments of the first aspect that the gas injector may enable faster and more complete mixing of the reactant gases thanks to the presence of the mixing chamber.

It may be an advantage of embodiments of the first aspect that it may allow for reduced particle deposition inside the main body of the gas injector thanks to the presence of the mixing chamber enabling improved mixing of the reactant gases before they enter into the body of the gas injector.

In a second aspect, the present invention may relate to a vertical furnace for processing a plurality of wafers. The vertical furnace may comprise a process chamber. The process chamber may be positioned in a vertical direction. It may also comprise a wafer boat, inside the process chamber, for holding a plurality of wafers. It may also comprise a gas injector inside the process chamber, for delivering a process gas into the process chamber. The gas injector may extend in a vertical direction inside the process chamber and may be elongated along a first axis from a first end to a second end. The gas injector may comprise a main body and further may comprise a mixing chamber near the second end. The mixing chamber may have a first and a second inlet for providing a first and a second reactant gas, thereby providing mixing in the mixing chamber at a temperature lower than that in the main body.

It may be an advantage of embodiments of the second aspect that it may allow for processing plurality of wafers without reducing the throughput of the vertical furnace. The mixing of the reactant gases being carried out in the mixing chamber directly before entry into the main body of the gas injector, may allow for mixing in the mixing chamber at a lower temperature than in the main body of the gas injector. This may reduce the possibility of condensation. This thus, may reduce the risk of particle deposition inside the main body of the gas injector. Particle deposition inside the main body of the gas injector can lead to increased downtime of the vertical furnace, thereby reducing the throughput.

It may be an advantage of embodiments of the second aspect that it may allow for depositing films of higher quality and better uniformity on a plurality of substrates thanks to a uniform gas concentration and a uniform gas composition provided by the improved mixing in the mixing chamber.

It may further be an advantage of embodiments of the second aspect that the mixing chamber may directly be below the main body of the gas injector, thereby allowing a reduced pressure drop in the main body of the gas injector.

It may still further be an advantage of embodiments of the second aspect that the mixing chamber may directly be below the main body of the gas injector, thereby allowing a lowered temperature in the main body of the gas injector.

Particular and preferred aspects of the invention are set out in the accompanying independent and dependent claims. Features from the dependent claims may be combined with features of the independent claims and with features of other dependent claims as appropriate and not as merely set out in the claims.

Although there has been constant improvement, change and evolution of gas injectors in this field, the present concepts are believed to represent substantial new and novel improvements, including departures from prior art practices, resulting in the provision of more efficient, stable and reliable gas injectors of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the appended drawings.

BRIEF DESCRIPTION OF THE FIGURES

The above, as well as additional objects, features and advantages of the present inventive concept, will be better understood through the following illustrative and non-limiting detailed description, with reference to the appended drawings. In the drawings like reference numbers will be used for like elements unless stated otherwise.

DETAILED DESCRIPTION OF THE INVENTION

Figure 1A:
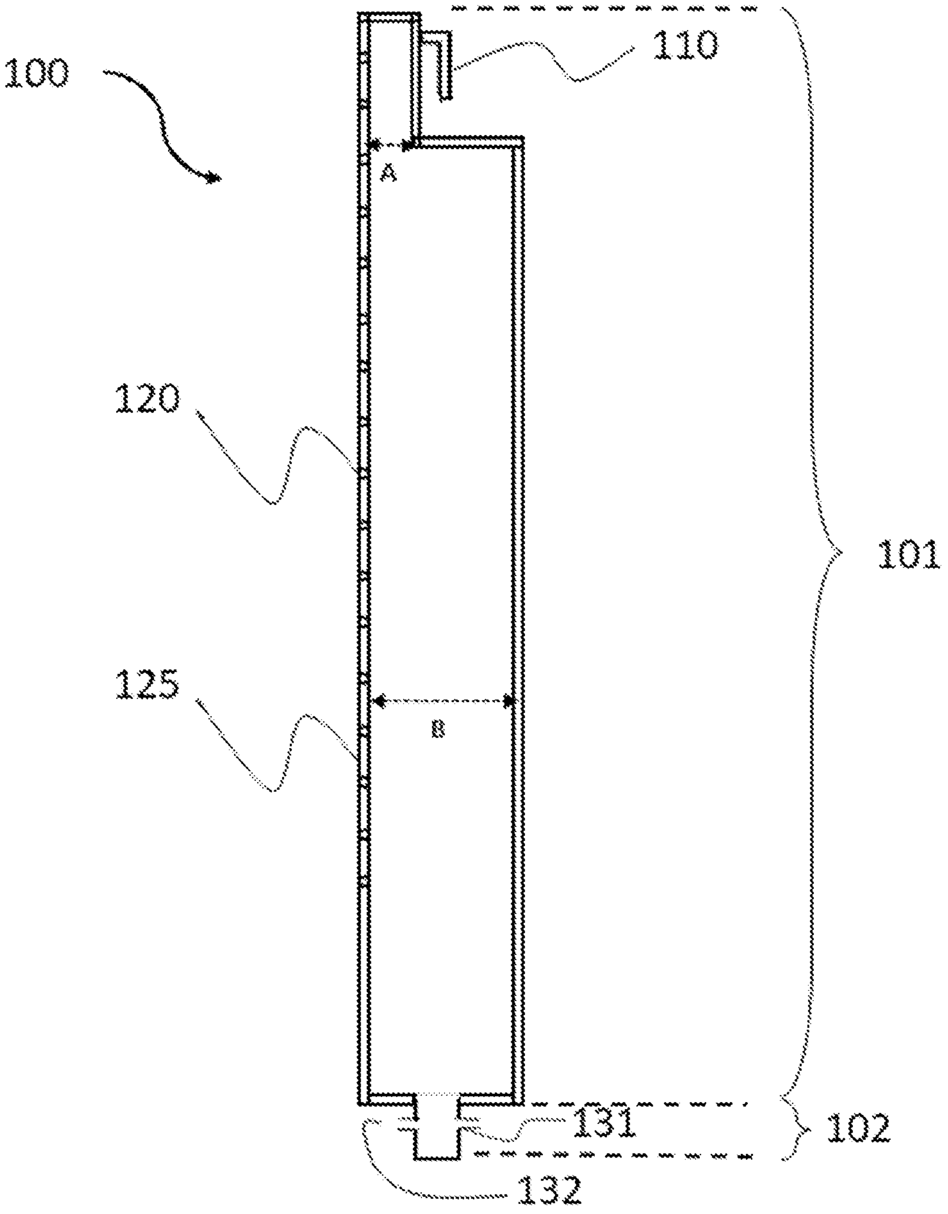
FIG. 1*a*: is a schematic front view of a gas injector in accordance with embodiments of the first aspect of the present invention.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn to scale for illustrative purposes. The dimensions and the relative dimensions do not correspond to actual reductions to practice the invention.

It is to be noticed that the term “comprising”, used in the claims, should not be interpreted as being restricted to the means listed thereafter; it does not exclude other elements or steps. It is thus, to be interpreted as specifying the presence of the stated features, integers, steps or components as referred to, but does not preclude the presence or addition of one or more other features, integers, steps or components, or groups thereof.

Reference throughout the specification to “one embodiment” or “an embodiment” means that a particular feature, structure or characteristic described in connection with the embodiment is included in at least one embodiment of the present invention. Thus, appearances of the phrases “in one embodiment” or “in an embodiment” in various places throughout the specification are not necessarily all referring to the same embodiment, but may. Furthermore, the particular features, structures or characteristics maybe combined in any suitable manner, as would be apparent to one of the ordinary skill in the art from the disclosure, in one or more embodiments.

Similarly, it should be appreciated that in the description of exemplary embodiments of the invention, various features of the invention are sometimes grouped together in a single embodiment, figure or description thereof for the purpose of streamlining the disclosure and aiding in the understanding of one or more of the inventive aspects. The method of disclosure, however, is not to be interpreted as reflecting an intention that the claimed invention required more features than are expressly recited in each claim. Rather, as the following claims reflect, inventive aspects lie in less than all features of a single foregoing disclose embodiment. Thus, the claims following the detailed description are hereby expressly incorporated into the detailed description, with each claim standing on its own as a separate embodiment of the invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practices without these specific details. In other instances, well-known methods, structures and techniques have not been shown in detail in order not to obscure an understanding of the description.

The following terms are provided solely to aid in the understanding of the invention.

As used herein and unless provided otherwise, the term “substantially bowed” refers to a portion of the inlet tubes having a bent to the left or to the right of the first axis such that the inlet tubes are no longer elongated along the first axis in the bent portion. In other words, this infers a change in the direction of the inlet tubes in their elongation along the first axis.

As used herein and unless provided otherwise, the term “pitch value of process gas injection holes” refers to the sum of the diameter of one of the process gas injection holes and the spacing between that process gas injection hole and an adjacent one.

As used herein and unless provided otherwise, the term “diameter of the process gas injections holes being substantially the same” refers to a difference of less than 10% in the diameter of the process gas injection holes.

As used herein and unless provided otherwise, the term “residence time” refers to the amount of time the process gas remains inside the process chamber before being exhausted.

As used herein and unless provided otherwise, the term “short radius elbow” refers to its radius of curvature being equal to outer diameter of the inlet tube.

As used herein and unless provided otherwise, the term “long radius elbow” refers to its radius of curvature being equal to 1.5 times the outer diameter of the inlet tube.

As used herein and unless provided otherwise, the term “spacing gradient” refers to the gradient in the distance between gas injection holes.

The invention will now be described by a detailed description of several embodiments of the invention. It is clear that other embodiments of the invention can be configured according to the knowledge of persons skilled in the art without departing from the technical teaching of the invention, the invention being limited only by the terms of the appended claims.

A schematic front view of a gas injector in accordance with embodiments of the first aspect of the present invention is shown in FIG. 1*a*.

Figure 1B:
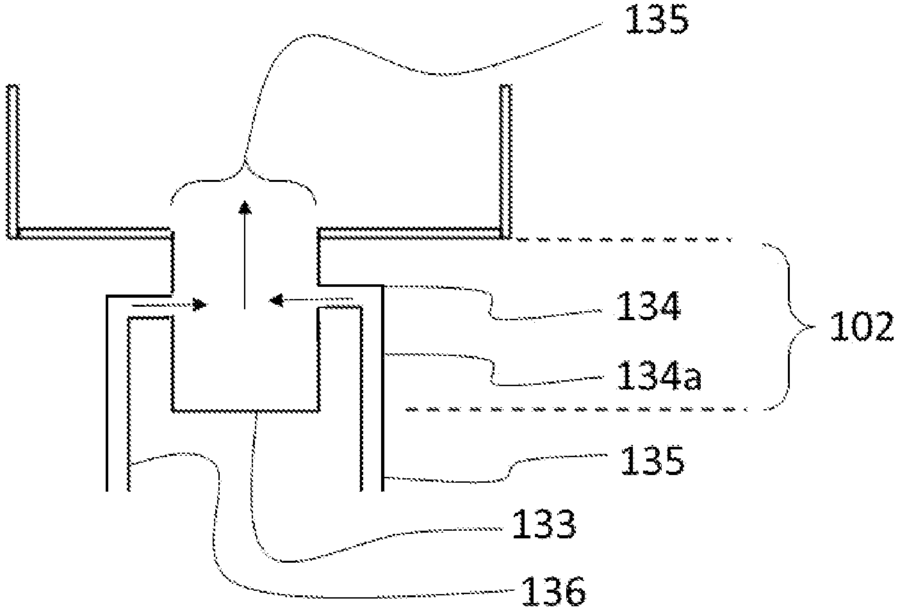
FIG. 1*b*: is a schematic front view of a mixing chamber in connection with the gas injector in accordance with embodiments of the first aspect of the present invention.

FIG. 1*b* shows a schematic front view of a mixing chamber in connection with the gas injector in accordance with embodiments of the first aspect of the present invention.

This gas injector (100) may be suitable for injecting a process gas in a process chamber. The process gas can be chosen depending on the type of the process to be carried out in the process chamber. This process chamber may be any type of a process chamber. The process chamber may be a process chamber such as, for example, for depositing a film on a substrate or such as, for example, for making chemical production. The process gas may thus, be a gas such as, for example, for depositing the film on the substrate or a gas such as, for example, for carrying out chemical reactions leading to chemical production. In embodiments, the process gas may be a gas mixture. The gas injector (100) may be elongated along a first axis from a first end to a second end. Thus, the gas injector (100) may, in embodiments, be employed with a vertical furnace or with a horizontal furnace. In preferred embodiments, the gas injector may be employed with a vertical furnace.

The gas injector (100) may comprise an injector tube (125) that may be extending to the first end. The injector tube (125) may comprise a plurality of process gas injection holes (120). These injection holes may be spaced apart from one another along the first axis to deliver the process gas in the process chamber. These injection holes may be advantageous in distributing the process gas in an area in the process chamber. Thus, the plurality of these process gas injection holes (120) may allow for overcoming process variations. These process variations may be, such as for example, in uniformity, in thickness and in composition of a film that is being deposited on a substrate in the process chamber. These variations may also be such as, for example, in process gas concentrations of a gaseous reaction, which can then lead to variation in reaction kinetics inside the process chamber.

In embodiments, diameter of the process gas injections holes (120) may be substantially the same. This may provide uniform provision of the process gas in the area in the process chamber. By uniform provision it is to be understood that the flow rate of the process gas through each of the process gas injection holes (120) may be the same. This leads to a uniform film deposition on a substrate that is being processed in the process chamber.

In embodiments, these injection holes (120) may be equally spaced apart from one another. In view of the fact that diameter of the process gas injections holes (120) may be substantially the same, this means, in other words, that the pitch value of these injection holes (120) may be constant or may substantially be the same. It is to be understood that for processes with challenging process control requirements, the diameter of the process gas injection holes may be configured differently along said first axis as required. This can enable process control optimization.

In alternative embodiments, the process gas injection holes (125) may have a pitch value being larger near the second end of the gas injector than that near the first end. This may also indicate that the spacing between the injection holes (120) may be increasing along the first axis from the first end to the second end, in view of the fact that diameter of the process gas injections holes (120) may be substantially the same. The pressure inside the main body (101) of the gas injector (100) may be higher near the second end compared to the first end. Thus, the pitch of the process gas injection holes (125) or in other words, their spacing may be larger in this portion. The lower pressure near the first end may require more injection holes in this portion. This means, injections holes having a smaller pitch value may be needed in order to get the gas inside the process chamber. Therefore, the difference in the pitch value along the first axis from the first end to the second end may help to accommodate the difference in the pressure of the process gas inside the main body (101) of the gas injector (100), thereby allowing equal amount of gas to be delivered inside the process chamber. This may provide even distribution of the process gas inside the process chamber. In embodiments, where deposition is being carried on a substrate in the process chamber, this thereby may allow uniform film deposition.

The pitch value of the process gas injection holes (125) usually depends on the size of the gas injector itself (100). Thus, in embodiments, where the gas injector (100) may be narrower, the spacing gradient may need to be steep. This is because when the gas injector is narrower, the pressure drop inside the gas injector is larger. As a result of this, the gas injection holes located in a lower portion of the gas injector with high pressure may provide more supply to the process chamber than the gas injection holes located in an upper portion of the gas injector. Therefore, the spacing gradient of the gas injection holes may need to be approximately as steep as the pressure gradient inside the gas injector.

In embodiments, where process gas injection holes (125) having a diameter in the range of 1 mm to 1.5 mm may be provided, then the pitch value may also be smaller, such as, for example, in the range 20 mm to 35 mm.

In embodiments, where process gas injection holes (125) having a diameter in the range of 4 mm to 6 mm may be provided, then the pitch value may be, such as, for example, in the range 15 mm to 200 mm.

In embodiments, there may be a portion of the injector tube (125) having no injection holes. This may be advantageous in order to accommodate further the pressure difference of the process gas inside the main body (101) of the gas injector (100). It is to be understood that a lower portion of the gas injector may be free of gas injection holes. This is because there is locally no load to consume the process gas in that portion. Therefore, the lowest positioned gas injector holes may serve the wafers starting from the lowest wafer slot in a wafer boat. This, therefore, may be a bit higher than the mixing chamber.

In alternative embodiments, the gas injector may have 2 injector tubes. The first of which may have the process gas injection holes near the first end, while the second of which may have the process gas injection holes near the second end. In this way, the process gas can still be evenly provided in the process chamber. This allows for uniform film deposition in case for example a deposition is being carried on a substrate in the process chamber. It is to be understood that in these alternative embodiments, the respective placement and the pitch value of the process gas injection holes (125) in each of the injection tubes may be adjusted with respect to one another.

The gas injector (100) may further comprise a feed entry (135) (FIG. 1*b*) of the injector tube (125) for injecting the process gas into the injector tube (125).

In embodiments, the cross-section of the feed entry (135) may be bigger than the cross section of the first (131) or the second inlet (132). This may allow for providing a better mixing.

In alternative embodiments, where the gas injector (100) may have 2 injector tubes, the feed entry (135) may be configured for providing the process gas to both of the injector tubes.

The gas injector (100) may further comprise a mixing chamber (102). This mixing chamber may be provided near the second end. It may be configured to mix a first reactant gas and a second reactant gas, thereby forming the process gas. The mixing chamber (102) may be directly connected to the feed entry (135). This may have the advantage that once mixing is performed in the mixing chamber (102), the gas mixture can be provided immediately into the injector tube (125), thereby reducing the risk of exposing the substrate to the reactant gases individually or without complete mixing.

In embodiments, the mixing chamber (102) may have dimensions up to 20 mm to 25 mm in x, y and z directions. In alternative embodiments, the dimensions may be larger than this. It is to be understood that the dimensions of the mixing chamber (102) may be configured according to the specific dimensions of the main body (1010 of the gas injector (100), according to the specific dimensions of the process chamber and last but not the least according to the reactant gases to be mixed.

In embodiments, the mixing chamber may have a bottom floor (133) near the second end which is constructed planar along the second axis to support the gas injector (100) in the process chamber. This may allow for a larger mixing volume. A larger mixing volume may have the advantage of providing an improved mixing in the mixing chamber.

The mixing chamber (102) may have a first (131) and a second (132) inlet for letting the first and second reactant gas in the mixing chamber (102), respectively. The first (131) and the second (132) inlets may be facing each other in order to improve mixing in the mixing chamber (102) of the first and the second reactant gas. Improved mixing in the mixing chamber may result in a homogeneous gas composition in the mixing chamber.

In embodiments, the first inlet (131) and the second inlet (132) may each have its own diameter. The diameter of the first (131) and the second inlet (132) may be configured for providing the first reactant gas and the second reactant gas with the required pressure value. Therefore, in embodiments, the diameter of the first (131) and the second inlet (132) for injecting the first and second reactant gas, respectively may be different from one another.

In alternative embodiments, the diameter of the first (131) and the second inlet (132) for injecting the first and second reactant gas, respectively may be the same as one another. It is to be understood that the pressure of the first or the second reactant gas may be a function of the choice of these reactant gases respectively. In some embodiments, the pressure of the first (or the second) reactant gas may need to be kept at a lower value compared to that of the second (or the first) reactant gas. In these embodiments, the diameter of the inlet for injecting that reactant gas that needs to be kept at a lower pressure may be larger than that of the other one. This may be advantageous in order to overcome particle contamination. Particle contamination may occur as a result of deposition inside the inlet tubes. The deposition may lead to a reduction in the cross sectional area, thus resulting in increased pressure. This may lead to gas phase reactions resulting in particle formation.

In embodiments, the first (131) and second (132) inlets may be facing each other along a second axis that is perpendicular to the first axis. This may be advantageous since this may allow for a quicker mixing thanks to head-on mixing being enabled. Furthermore, mixing may be enabled at a lower temperature than that might have been required in case they would be located at second axis values that are perpendicular to the first axis but being different from one another.

In embodiments, the first (131) and second (132) inlets may be connected to first and second inlet tubes (135, 136) for providing the first and second reactant in the mixing chamber (102), respectively (FIG. 1*b*). These inlet tubes may thus, enable separate provision of the first and the second reactant gas into the mixing chamber. In embodiments, the first and second inlet tubes for providing the first and second reactant in the mixing chamber may be provided near a second end of the gas injector.

In embodiments, the first (135) and second (136) inlet tubes may be constructed with an elongated portion (134*a*) being elongated along the first axis to position the gas injector in the process chamber with its first axis extending in the vertical direction. In these embodiments, the first (135) and second (136) inlet tubes may be constructed with a substantially bowed portion (134) connecting the elongated portion (134*a*) to the mixing chamber (FIG. 1*b*).

In embodiments, the substantial bowed portion (134) may be a 90-degree bend. The term 90-degree bend may, in embodiments, be interchangeably used with the term 90-degree elbow. The 90-degree bend may, in embodiments, be a 90-degree elbow with a short radius elbow or a 90-degree elbow with long radius elbow.

Figure 2A:
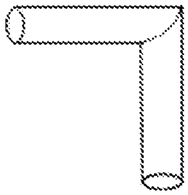
FIG. 2*a* to FIG. 2*d*: are schematic views of a substantially bowed portion of the inlet tubes in accordance with embodiments of the first aspect of the present invention.
Figure 2B:
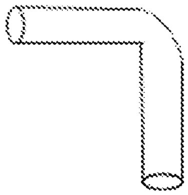
Figure 2C:
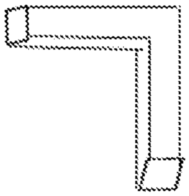
Figure 2D:
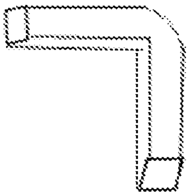

FIG. 2*a* to FIG. 2*d* illustrate schematic views of a substantially bowed portion of the inlet tubes being a 90 degree bend in accordance with embodiments of the first aspect of the present invention. While FIG. 2*a* and FIG. 2*b* illustrate 90-degree bends with round cross sections, FIG. 2*c* and FIG. 2*d* illustrate 90-degree bends with square cross sections. In FIG. 2*a*, a 90-degree bend with the round cross section is illustrated having a sharp inner edge and a sharp outer corner. In FIG. 2*b*, a 90-degree bend with the round cross section is illustrated having a sharp inner edge and a rounded outer corner. In FIG. 2*c*, a 90-degree bend with the square cross section is illustrated having a sharp inner edge and a sharp outer corner. In FIG. 2*d*, a 90-degree bend with the square cross section is illustrated having a sharp inner edge and a rounded outer corner. Depending on the choice of the first reactant gas and the second reactant gas to be mixed in order to form the process gas in the mixing chamber (102), one of these 90-degree bend options regarding the inlet tubes (135, 136) may be chosen. A 90-degree bend with the round cross section having a sharp inner edge and a sharp outer corner is illustrated as an example in FIG. 1*b*. The choice of the 90-degree bend having a long radius or short radius may depend on several factors such as, for example, the dimensions of the main body (101) gas injector, dimension of the mixing chamber (102), diameter of the inlets, diameter of the inlet tubes, when there are space considerations or the need for creating a lesser or a higher pressure drop.

In embodiments, the mixing chamber (102) may have a bottom floor (133) at its second end which may be constructed planar along the second axis and the bowed portion (134) may be connecting to the mixing chamber (102) away from the bottom floor (133). This may be advantageous since it may allow for the first reactant gas and the second reactant gas to be mixed inside the mixing chamber (102).

In embodiments, the substantially bowed portion (134) may be connecting to the mixing chamber (102) in the middle of the mixing chamber (102) between the bottom floor (133) and the feed entry (135). This may allow for improved mixing in the mixing chamber (102) before the mixed reactant gases are provided into the main body (101) of the gas injector (100) through the feed entry (135). In embodiments, where the mixing chamber (102) may be made longer in the vertical direction compared to the other two directions (not shown in the figures), it may be advantageous to connect the substantially bowed portion, still in the middle of the mixing chamber. However, in embodiments, where reactant gases may be such that more time would be necessary for mixing, then it may be advantageous to connect the substantially bowed portion at a point lower than the middle (not shown in the figures) of the mixing chamber (102) between the bottom floor (133) and the feed entry. This then may allow for improved mixing of such reactant gases that require more time for the improved mixing before being provided into the main body (101) of the gas injector (100) through the feed entry (135).

In embodiments, the gas injector (100) may be constructed to be positioned in the process chamber with its first axis extending in a vertical direction. This may be advantageous since it may allow for providing the gas injector in a vertical furnace. This vertical furnace may host a plurality of wafers provided in a wafer boat and thus, this may lead to the processing of the plurality of wafers at the same time, thereby increasing throughput. Furthermore, the mixture of the first reactant gas and the second reactant gas obtained in the mixing chamber (102) may be distributed evenly in the vertical direction, thereby allowing the plurality of wafers getting evenly exposed to the mixture of the first reactant gas and the second reactant gas.

In embodiments, the gas injector may be constructed with a hook (110) near the first end of the gas injector constructed to position the gas injector in the process chamber with its first axis extending in a vertical direction. The presence of such a hook (110) may secure the gas injector, near its first end, inside the process chamber.

In embodiments, the hook (110) may be constructed with an elongated end portion aligned along the first axis to position the gas injector in the process chamber with its first axis extending along the vertical direction. With this structural configuration, the hook may secure the gas injector inside the process chamber. Furthermore, the hook (110) may provide freedom for positioning the gas injector (100) at any point along the first axis in the process chamber.

In embodiments, as illustrated in FIG. 1*a*, a cross section (A) of the gas injector near its first end may be smaller than a cross section (B) near its second end, and wherein the elongated end portion of the hook may be positioned in a space provided next to the smaller cross section of the gas injector (100) near its first end. This may allow for providing a better support of the gas injector without strain on the inlets, where better support may indicate being stable against tipping over. Furthermore, it may be achieved without a more complex shape of the liner.

Figure 3:
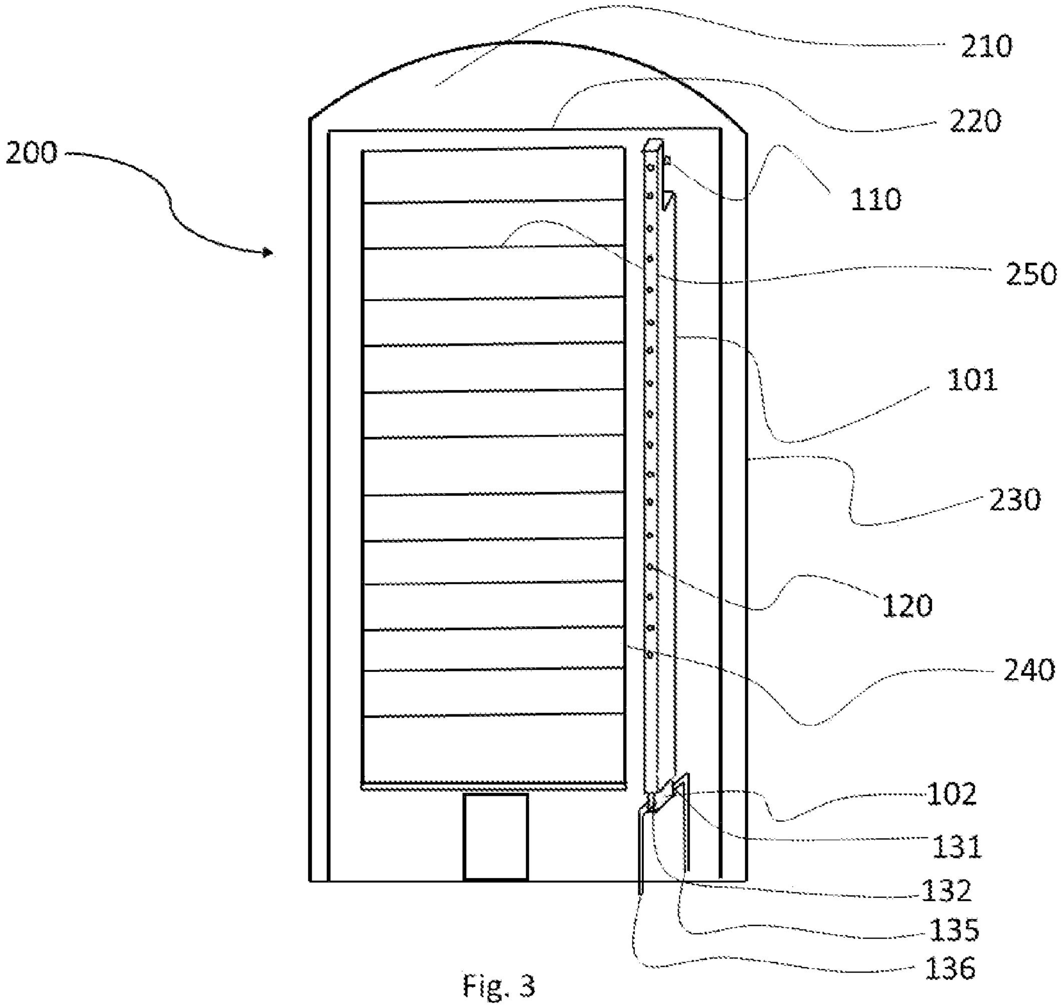
FIG. 3: is a schematic cross sectional view of a vertical furnace according to the embodiments of the second aspect of the present invention with a gas injector constructed according to embodiments of the first aspect of the present invention.

FIG. 3 illustrates a schematic cross sectional view of a vertical furnace (200) according to embodiments of the second aspect of the present invention with a gas injector constructed according to embodiments of the first aspect of the present invention.

This vertical furnace (200) for processing a plurality of wafers may comprise a process chamber (210) that may be positioned in a vertical direction. It may further comprise a wafer boat (240) inside the process chamber (210) for holding the plurality of wafers (250). Further, a gas injector (100) may be comprised, inside the process chamber (210), for delivering a process gas into the process chamber. The gas injector may extend in a vertical direction inside the process chamber (210) and may be elongated along a first axis from a first end to a second end.

In embodiments, the gas injector may extend in a vertical direction along the height of the wafer boat. This may be advantageous since it may allow even provision of the process gas to each of the plurality of wafers in the wafer boat. This may avoid problems such as, for example, regarding non-uniformity of deposition between different wafers in the wafer boat (240). Non-uniformity of deposition between different wafers in the wafer boat may jeopardize the yield of the process carried out in this vertical furnace (200).

The gas injector (100) may comprise a main body (101) and may further comprise a mixing chamber (102) near the second end. The mixing chamber (102) may have a first (131) and a second (132) inlet for providing a first and a second reactant gas, thereby providing mixing in the mixing chamber (102) at a temperature lower than that in the main body (101).

It may be an advantage of this mixing chamber (102) comprised in the gas injector (100) that it may allow for mixing at a temperature that may be lower than that in the main body (101) of the gas injector. Mixing at a lower temperature thanks to the mixing chamber (102) may reduce the risk of unwanted deposition to occur, particularly in the main body (101) of the gas injector (100).

It may therefore, be an advantage of this vertical furnace (200) that it may allow for processing plurality of wafers without reducing the throughput as unwanted depositions, particularly in the main body (101) of the gas injector (100) could lead to increased downtime of this furnace (200).

It may further be an advantage of this vertical furnace (200) that it may allow for obtaining a uniform gas concentration and a uniform gas composition of the process gas being provided in the process chamber thanks to the improved mixing in the mixing chamber (102). The uniform gas concentration and the uniform gas composition may lead to the deposition of films of higher quality and better uniformity on a plurality of substrates. This may be due to the fact that improved mixing may resolve uneven distribution of the gas concentration. Uneven gas concentration may lead to different reaction kinetics, which then adversely may affect the quality and the uniformity of the deposited films on each of the plurality of substrates.

In embodiments, the first reactant gas and the second reactant gas may be mixed in the mixing chamber (101) at a temperature in the range of 140° C. to 450° C. This may provide absence of condensation in the gas injector. Thanks to the mixing chamber comprised in the gas injector (100) that may be comprised in this vertical furnace (200), mixing may be facilitated at a temperature in this relatively low temperature range. The first and the second reactant gas may be heated up to about 140 C in the flange before entering into the mixing chamber (102).

In embodiments, the gas injector (100) may deliver the process gas, into the process chamber (210), into a space between the wafer boat (240) and a tubular liner (220). In this way, immediate contact of the process gas with each of the plurality of wafers may be provided. This may have the advantage that the residence time of the process gas inside the process chamber may be reduced. Reduction in residence time may have direct influence on improving the throughput of the process carried out in the vertical furnace.

In embodiments, the vertical furnace may be a Chemical Vapor Deposition (CVD) furnace for depositing silicon nitride on a plurality of wafers. Therefore, in embodiments, the first reactant gas may be a nitrogen containing gas and the second reactant gas may be a silicon containing gas. Using the nitrogen containing gas and the silicon containing gas as reactant gases, deposition of silicon nitride may be achieved on the plurality of wafers. Silicon nitride deposition may be achieved, in embodiments, where the nitrogen containing gas may comprise substantially $NH_3$ and the silicon containing gas may comprise substantially di-chloro silane (DCS).

It may be advantageous to have a mixing chamber for mixing the nitrogen containing gas that may comprise substantially $NH_3$ and the silicon containing gas that may comprise substantially DCS. This may be because DCS may get deposited inside the DCS inlet tube. As DCS is deposited, it may reduce the cross sectional area of the inlet tube (135). Reduction in cross sectional area may lead to an increase in pressure inside the DCS inlet tube. Increased pressure inside the DCS inlet tube (135) could result in gas phase reactions causing the formation of particles. Presence of particles inside the DCS inlet tube may then result in a decrease in throughput of the process inside the vertical furnace and increase in downtime of the vertical furnace itself. Therefore, thanks to the presence of the mixing chamber, such problems may be alleviated.

In these embodiments, where the nitrogen containing gas may comprise substantially $NH_3$ and the silicon containing gas may comprise substantially di-chloro silane (DCS), the diameter of the DCS inlet (131) may be tens of millimeters, while the diameter of the inlet for $NH_3$ (132) may be tenths of a millimeter. It is to be understood that the requirements on the diameter of the first (131) and second (132) inlet for providing the first and second reactant gas into the mixing chamber may need to be configured further when a different nitrogen containing gas and a different silicon containing gas are used for the deposition of silicon nitride.

In alternative embodiments, silicon nitride deposition may be achieved where, the nitrogen containing gas may comprise substantially $N_2$ and the silicon containing gas may comprise substantially di-chloro silane (DCS) or silane. In these embodiments, the diameter of the DCS inlet or silane inlet (131) may be tens of millimeters, while the diameter of the inlet for $N_2$ (132) may be tenths of a millimeter.

The invention claimed is:

1. A gas injector for injecting a process gas into a vertical furnace that includes a water boat holding a plurality of semiconductor wafers distributed along a vertical direction, the gas injector being elongated along a first axis from a first end to a second end, and comprising:

- an injector tube extending to the first end and comprising a plurality of process gas injection holes spaced apart from one another along said first axis and arranged to deliver the process gas to each of a plurality of semiconductor wafers in the wafer boat;
- a feed entry of the injector tube for injecting the process gas into the injector tube; and
- a mixing chamber provided near the second end and configured to mix a first reactant gas and a second reactant gas, thereby forming the process gas,
- wherein the mixing chamber is directly connected to the feed entry and has first and second inlets for feeding the first reactant gas and second reactant gas, respectively, into the mixing chamber, and
- wherein the first and the second inlets are facing each other to improve mixing in the mixing chamber of the first reactant gas and the second reactant gas, and wherein the first and the second inlets are facing each other along a second axis perpendicular to the first axis, and
- wherein the gas injector is constructed to be positioned in a space between the wafer boat and a liner around the wafer boat within the vertical furnace with the first axis extending in the vertical direction.

2. The gas injector according to claim 1, wherein the gas injector is constructed with a hook near the first end of the gas injector, and wherein the hook is constructed to position the gas injector in the vertical furnace with the first axis extending in the vertical direction.

3. The gas injector according to claim 2, wherein the hook is constructed with an elongated end portion aligned along the first axis to position the gas injector in the vertical furnace with the first axis extending along the vertical direction.

4. The gas injector according to claim 1, wherein the mixing chamber has a bottom floor, near the second end, which is constructed planar along the second axis to support the gas injector in the vertical furnace.

5. The gas injector according to claim 1, wherein the first and the second inlets are connected to first and second inlet tubes, respectively, for providing the first and the second reactant gases in the mixing chamber.

6. The gas injector according to claim 5, wherein the first and the second inlet tubes for providing the first and the second reactant gases in the mixing chamber are provided near the second end of the gas injector.

7. The gas injector according to claim 6, wherein the first and the second inlet tubes are constructed with an elongated portion being elongated along the first axis to position the gas injector in the vertical furnace with the first axis extending in a vertical direction.

8. The gas injector according to claim 7, wherein the first and the second inlet tubes are constructed with a substantially bowed portion connecting the elongated portion to the mixing chamber.

9. The gas injector according to claim 8, wherein the substantially bowed portion connects to a middle of the mixing chamber between a bottom floor and the feed entry.

10. The gas injector according to claim 3, wherein a cross section of the gas injector near the first end is smaller than near the second end, and wherein the elongated end portion of the hook is positioned in a space provided next to the gas injector near the first end.

11. The gas injector according to claim 1, wherein the process gas injection holes have a pitch value being larger near the second end of the gas injector than near the first end.

12. The gas injector according to claim 1, wherein the mixing chamber comprises:

- an open portion connected at the second end to the feed entry in the direction of the first axis;
- a bottom floor perpendicular to the first axis and opposite the open portion; and
- an enclosed surface between the open portion and bottom floor, wherein the first and the second inlets pass through the enclosed surface perpendicular to the first axis.

13. The gas injector according to claim 12, wherein the first and the second inlets are positioned in the enclosed surface closer to the bottom floor than to the open portion.

14. The gas injector according to claim 13, wherein the mixing chamber is longer in the direction of the first axis than in directions perpendicular to the first axis.

15. The gas injector according to claim 1, wherein a cross section of the feed entry is greater than a cross section of the first and the second inlets.

16. The gas injector according to claim 1, wherein the first reactant gas is a nitrogen containing gas, the second reactant gas is a silicon containing gas, and the mixing chamber is configured to mix the nitrogen containing gas and the silicon containing gas for depositing silicon nitride on the semiconductor wafers.

17. The gas injector according to claim 1, wherein the mixing chamber is positioned near the second end such that the first reactant gas and the second reactant gas are mixed at a temperature lower than that in the injector tube.

18. The gas injector according to claim 17, wherein the mixing chamber is configured to mix the first reactant gas and the second reactant gas at a temperature in the range of 140° C. to 450° C.

* * * * *